(12) United States Patent
Matsuno et al.

(10) Patent No.: US 8,847,078 B2
(45) Date of Patent: Sep. 30, 2014

(54) PRINTED WIRING BOARD AND METHOD FOR MANUFACTURING PRINTED WIRING BOARD

(71) Applicant: Ibiden Co., Ltd., Ogaki (JP)

(72) Inventors: Ryo Matsuno, Ogaki (JP); Koichi Kondo, Ogaki (JP); Satoru Kose, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 0 days.

(21) Appl. No.: 14/040,085

(22) Filed: Sep. 27, 2013

(65) Prior Publication Data

US 2014/0083747 A1  Mar. 27, 2014

Related U.S. Application Data

(60) Provisional application No. 61/706,345, filed on Sep. 27, 2012.

(51) Int. Cl.
*H05K 1/00* (2006.01)
*H05K 3/46* (2006.01)
*H05K 1/02* (2006.01)

(52) U.S. Cl.
CPC ............... *H05K 1/0274* (2013.01); *H05K 3/46* (2013.01)
USPC ........... 174/250; 174/251; 174/255; 174/256; 174/260; 361/777; 361/778; 361/779; 361/802

(58) Field of Classification Search
CPC . H05K 1/0266; H05K 1/0269; H05K 1/0274; H05K 1/0268; H05K 3/0008; H05K 2201/09918; H05K 3/46
USPC .......... 174/250, 251, 255, 256, 260; 361/802, 361/777–779, 807–812
See application file for complete search history.

(56) References Cited

U.S. PATENT DOCUMENTS

| | | | |
|---|---|---|---|
| 2003/0132025 A1* | 7/2003 | Wakihara et al. | 174/256 |
| 2005/0111206 A1* | 5/2005 | Borland et al. | 361/761 |
| 2005/0253275 A1* | 11/2005 | Hsu | 257/778 |
| 2009/0205854 A1* | 8/2009 | Lee et al. | 174/257 |
| 2010/0012356 A1* | 1/2010 | Hasegawa | 174/255 |
| 2010/0018630 A1* | 1/2010 | Uematsu et al. | 156/89.12 |
| 2010/0208437 A1* | 8/2010 | Maeda et al. | 361/760 |
| 2012/0073862 A1* | 3/2012 | Muramatsu et al. | 174/251 |

FOREIGN PATENT DOCUMENTS

JP       2001-053415       2/2001

* cited by examiner

*Primary Examiner* — Tuan T Dinh
*Assistant Examiner* — Steven T Sawyer
(74) *Attorney, Agent, or Firm* — Oblon, Spivak, McClelland, Maier & Neustadt, L.L.P.

(57) ABSTRACT

A printed wiring board includes an outermost interlayer resin insulation layer, n outermost conductive layer formed on the outermost interlayer resin insulation layer and including multiple alignment marks, a connection wiring structure connecting the alignment marks, and a solder-resist layer formed on the outermost interlayer resin insulation layer and the outermost conductive layer. The solder-resist layer has openings exposing the alignment marks, respectively, and each of the alignment marks has an electroless plated film formed on each of the alignment marks.

20 Claims, 13 Drawing Sheets

(A)

(B)

(C)

(D)

(A)

(B)

(C)

(A)

(B)

(A)

(B)

(A)

(B)

(A)

(B)

(A)

(B)

PRINTED WIRING BOARD AND METHOD FOR MANUFACTURING PRINTED WIRING BOARD

CROSS-REFERENCE TO RELATED APPLICATIONS

The present application is based upon and claims the benefit of priority from U.S. Application No. 61/706,345, filed Sep. 27, 2012, the entire contents of which are incorporated herein by reference.

BACKGROUND OF THE INVENTION

1. Field of the Invention

The present invention relates to a printed wiring board having alignment marks for mounting an IC chip, and to a method for manufacturing such a printed wiring board.

2. Description of Background Art

Alignment marks for positioning an IC chip are formed in a printed wiring board for mounting an IC chip. A gold layer, which is the same as an anticorrosion gold layer formed on solder bumps to mount an IC chip, may be formed on the alignment marks so that their reflectance is enhanced to make the marks easy to read by an optical apparatus. In Japanese Laid-Open Patent Publication No. 2001-53415, the gold-plated film on alignment marks is formed uniformly by connecting the alignment marks to wiring for plating that surrounds the printed wiring board. The entire contents of this publication are incorporated herein by reference.

SUMMARY OF THE INVENTION

According to one aspect of the present invention, A printed wiring board includes an outermost interlayer resin insulation layer, n outermost conductive layer formed on the outermost interlayer resin insulation layer and including multiple alignment marks, a connection wiring structure connecting the alignment marks, and a solder-resist layer formed on the outermost interlayer resin insulation layer and the outermost conductive layer. The solder-resist layer has openings exposing the alignment marks, respectively, and each of the alignment marks has an electroless plated film formed on each of the alignment marks.

According to another aspect of the present invention, a method for manufacturing a printed wiring board includes forming an outermost conductive layer including multiple alignment marks on an outermost interlayer resin insulation layer, forming a connection wiring structure such that the connection wiring structure connects the alignment marks, forming a solder-resist layer on the outermost interlayer resin insulation layer and the outermost conductive layer, forming openings in the solder-resist layer such that the openings expose the alignment marks, respectively, and forming an electroless plated film in the opening of the solder-resist layer such that each of the alignment marks has the electroless plated film formed on each of the alignment marks.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

6(A) is a plan view of an outermost interlayer resin insulation layer of a printed wiring board according to the first embodiment.

DETAILED DESCRIPTION OF THE EMBODIMENTS

Figure 1:
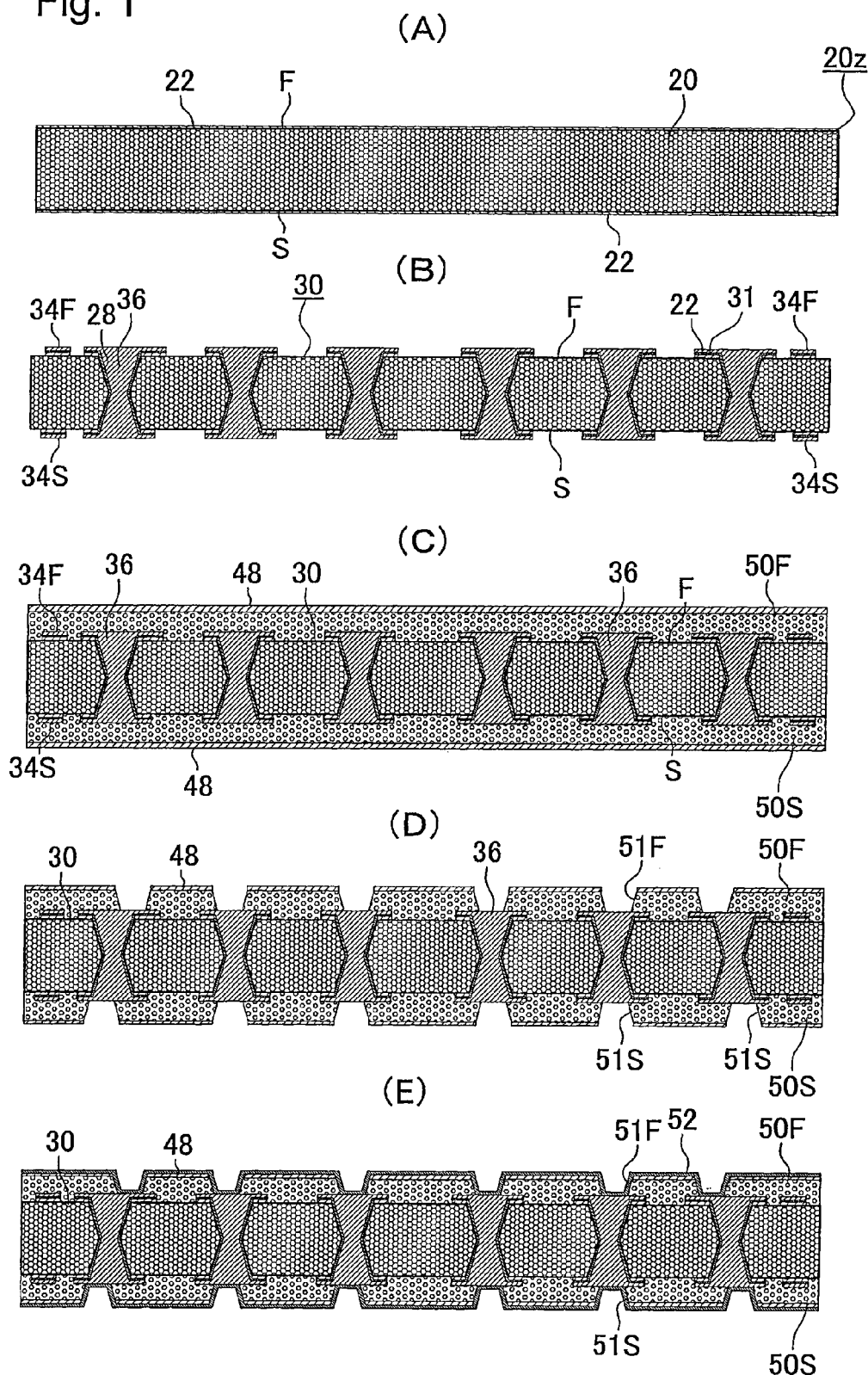
FIGS. 1(A)-1(E) are views of steps showing a method for manufacturing a printed wiring board according to a first embodiment of the present invention.

The embodiments will now be described with reference to the accompanying drawings, wherein like reference numerals designate corresponding or identical elements throughout the various drawings.

First Embodiment

Figure 4:
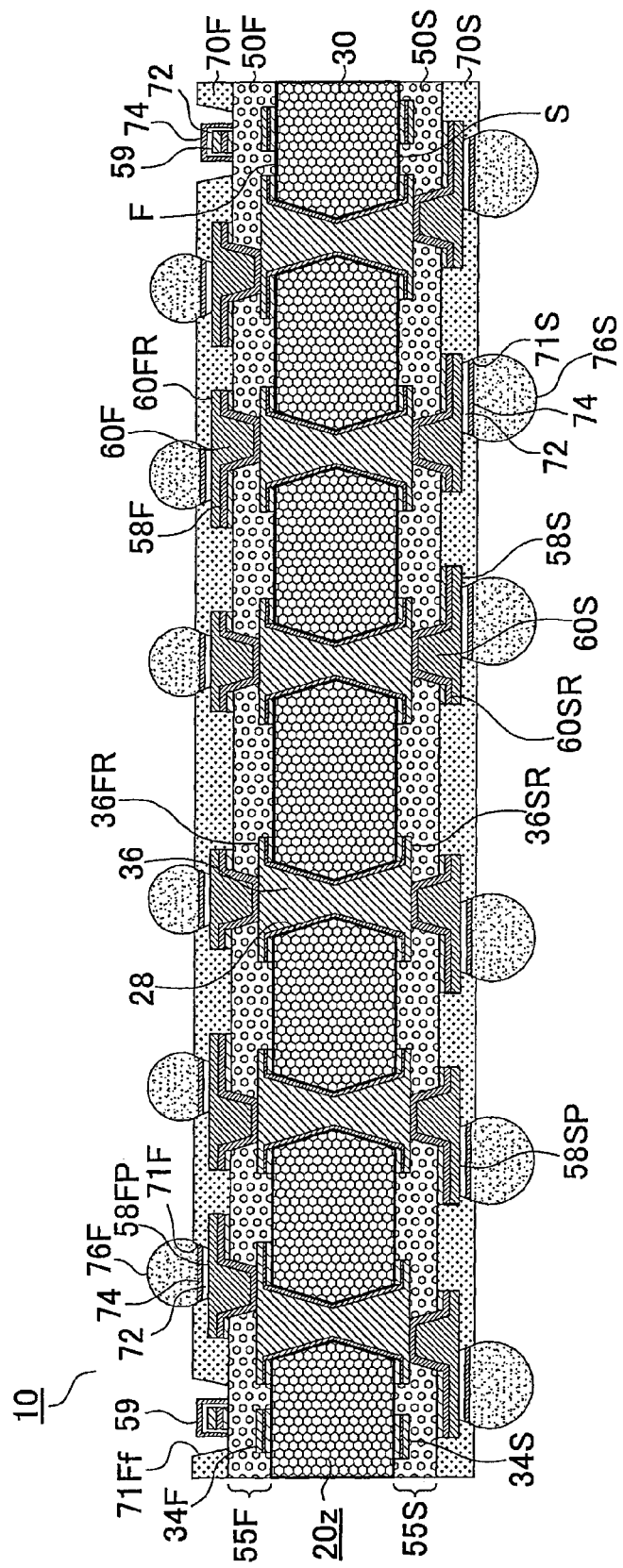
FIG. 4 is a cross-sectional view of a printed wiring board according to the first embodiment.

FIG. 4 shows a printed wiring board according to a first embodiment of the present invention.

Printed wiring board 10 of the first embodiment has core substrate 30. The core substrate includes insulative substrate (20z) having first surface (F) and second surface (S) opposite the first surface, first conductive layer (34F) formed on first surface (F) of the insulative substrate and second conductive layer (34S) formed on the second surface of the insulative substrate. The core substrate further includes through-hole conductor 36 connecting first conductive layer (34F) and second conductive layer (34S). A through-hole conductor is formed in penetrating hole 28 which penetrates through the insulative substrate. Penetrating hole 28 and the through-hole conductor are each shaped like an hourglass, with opening portions that respectively open on first surface (F) and second surface (S) of the core substrate, and tapering toward the center to be joined at the center. A conductive layer of the core substrate includes multiple conductive circuits and through-hole lands formed around through-hole conductors. The first surface of the core substrate corresponds to the first surface of the insulative substrate, and the second surface of the core substrate corresponds to the second surface of the insulative substrate.

Figure 6:
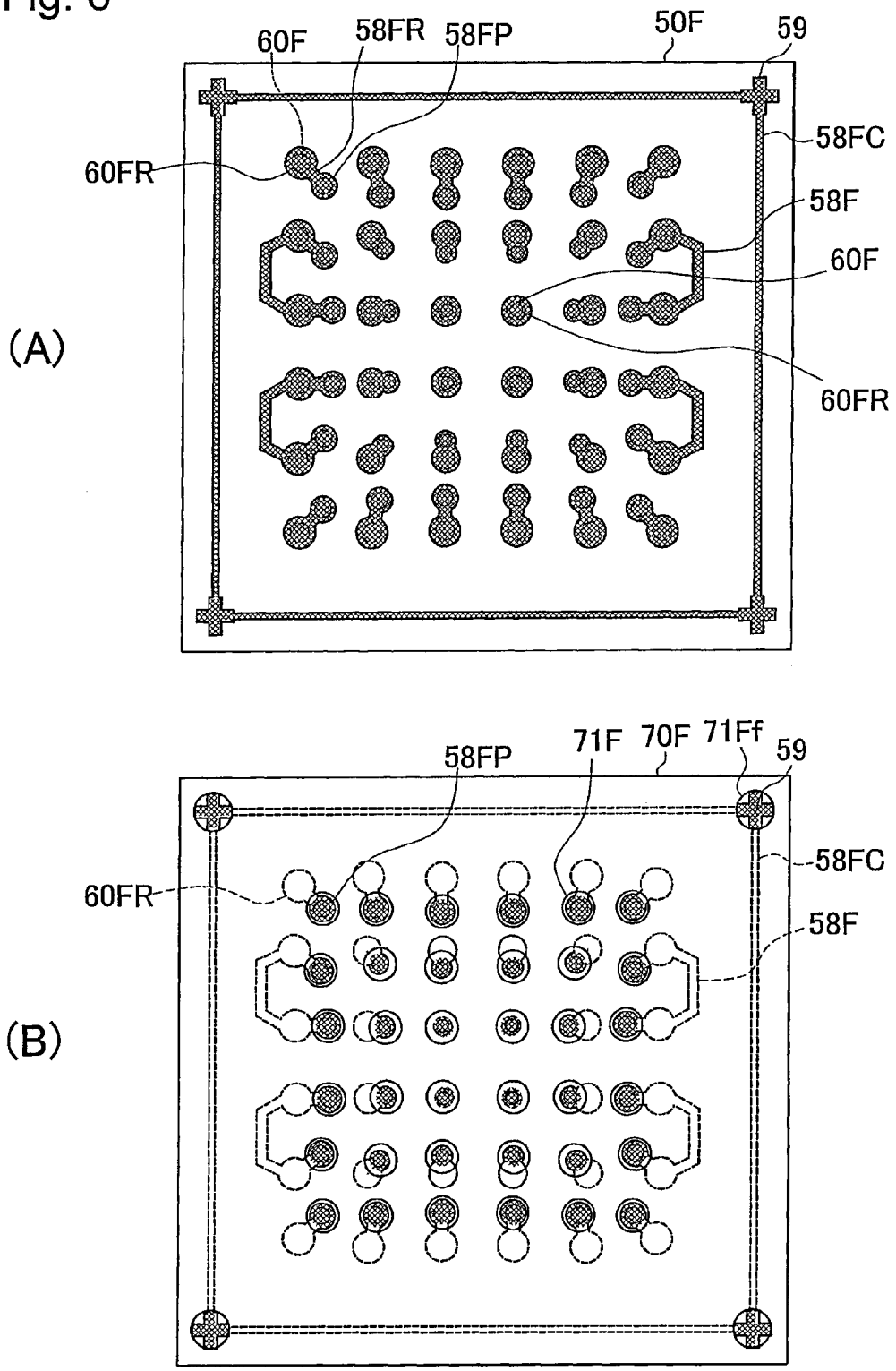
FIG. 6(B) is a plan view of an upper solder-resist layer.

Interlayer resin insulation layer (outermost resin insulation layer) (50F) is formed on first surface (F) of core substrate 30 and first conductive layer (34F). FIG. 6(A) shows a plan view of interlayer resin insulation layer (50F). Via lands (60FR) and conductive layer (58F) of an outermost conductive layer are formed on interlayer resin insulation layer (50F), and pad (58FP) is formed on portions of via land (60FR) and conductive layer (58F) exposed from later-described solder-resist layer (70F). Alignment marks 59 in the shape of a cross are formed near four corners of the printed wiring board. Alignment marks 59 are connected by frame-shaped connection wiring (58FC), which is thinner than a signal line portion of conductive layer (58F). FIG. 6(B) shows a plan view of solder-resist layer (70F). Nickel-plated film 72 and gold-plated film 74 are formed on surfaces of pads (58FP) and alignment marks 59 exposed from solder-resist layer (70F). Namely, gold-plated film with high reflectance is formed on the outermost layer of alignment marks 59, making them easier to be recognized by an optical apparatus. Conductive layer (58F) and via lands (60FR) are connected to first conductive layer (34F) and through-hole conductors 36 by via conductors (60F), which penetrate through interlayer resin insulation layer (50F). On the first-surface side of the core substrate, buildup layer (55F) is formed with interlayer resin insulation layer (50F), conductive layer (58F) and via conductors (60F). The first-surface side buildup layer is single layered in the first embodiment.

Interlayer resin insulation layer (50S) is formed on second surface (S) of core substrate 30 and second conductive layer (34S). Conductive layer (58S) and via lands (60SR) are formed on interlayer resin insulation layer (50S). Conductive layer (58S) is connected to second conductive layer (34S) and through-hole conductors 36 by via conductors (60S) which penetrate through interlayer resin insulation layer (50S). On the second-surface side of the core substrate, buildup layer (55S) is formed with interlayer resin insulation layer (50S), conductive layer (58S) and via conductors (60S). The second-surface side buildup layer is single layered in the first embodiment. First-surface side solder-resist layer (70F) is formed on the first-surface side buildup layer of the core substrate, and second-surface side solder-resist layer (70S) is formed on the second-surface side buildup layer. Solder-resist layer (70F) has openings (71F) that expose the conductive layer and pad (58FP) of a via conductor as well as openings (71Ff) that expose alignment marks 59. Solder-resist layer (70S) has openings (71S) that expose the conductive layer and pad (58SP) of a via conductor.

FIG. 6(B) is a plan view of first-surface side solder-resist layer (70F). Conductive layer (58F) and via lands (60FR) except for pad (58FP) exposed through opening (71F) of solder-resist layer (70F) are covered with solder-resist layer (70F). Alignment mark 59 in the shape of a cross is exposed through opening (71Ff) of solder-resist layer (70F), and connection wiring (58FC) connecting alignment marks 59 is covered with solder-resist layer (70F).

When electroless plated film is formed on a surface of an alignment mark, the area of reaction with an electroless plating solution increases in proportion to the area of the exposed surface of the alignment mark, thus increasing the number of electrons received from the electroless plating solution. Accordingly, it is thought that the electric potential on the alignment mark surface stabilizes, and the electroless plated film is securely formed. In an embodiment of the present invention, the size of alignment mark 59 formed on the outermost interlayer resin insulation layer is limited from a design perspective. Therefore, instead of forming multiple alignment marks 59 independently on an interlayer resin insulation layer, all alignment marks 59 are connected by connection wiring for short circuiting. At that time, even if the number of electrons received from an electroless plating solution to alignment mark surfaces differs among alignment marks 59, it is thought that the electrons move from a portion with high electric potential to a portion with low electric potential, giving all alignment marks 59 the same electric potential. Accordingly, electroless plated film is thought to be formed with a uniform thickness on all the alignment marks. Alignment marks 59 and connection wiring (58FC) are dummy patterns. Alternatively, they may be used as part of a plain layer for power source or ground to strengthen power source.

In the first embodiment, since connection wiring (58FC) is formed on outermost interlayer resin insulation layer (50F), alignment marks 59 and connection wiring (58FC) may be formed at the same time. Alternatively, it is not always required to form the connection wiring at the same time when alignment marks are formed on outermost interlayer resin insulation layer (50F). In a second embodiment, connection wiring (158FC) is formed on lower interlayer resin insulation layer (150F) beneath the outermost layer, and is connected to alignment marks 59 on the outermost interlayer resin insulation layer by via conductors (60F) or by via conductors (60F) and second connection wiring (159FC) (see FIGS. 12(A) and (B)). In such a case, since connection wiring (158FC) is not formed on outermost interlayer resin insulation layer (50F), it is easier to set the surface of solder-resist layer (70F) to be flat, and to form the layer with a uniform thickness. In addition, since connection wiring (158FC) is formed on lower interlayer resin insulation layer (150F) beneath outermost interlayer resin insulation layer (50F), the electrical characteristics are suppressed from lowering.

Figure 12:
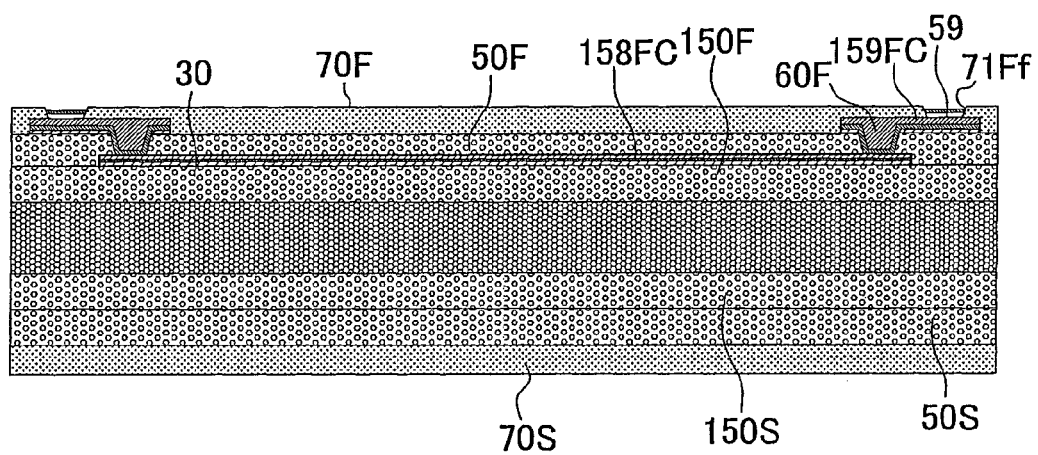
FIG. 12(A) is a cross-sectional view of the printed wiring board at (XA-XA) in FIG. 10(B)
FIG. 12(B) is a cross-sectional view of the printed wiring board at (X2-X2) in FIG. 11(A)
Figure 12:
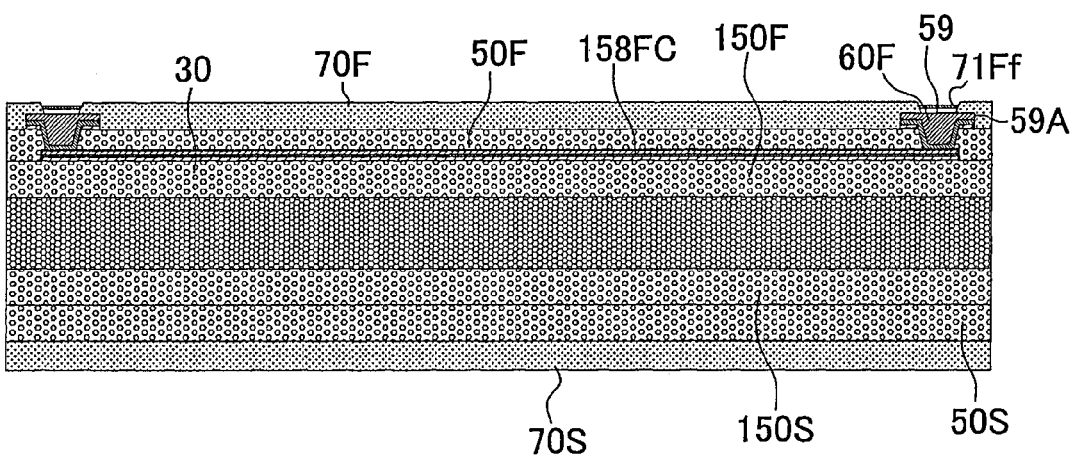

In the second embodiment, when an opening is formed in solder-resist layer (70F), and when both alignment mark 59 and outermost interlayer resin insulation layer (50F) are the bottom surface exposed on the bottom of opening (71F0, alignment mark 59 is connected to via conductor (60F) through second connection wiring (159FC) on outermost interlayer resin insulation layer (50F) (see FIG. 12(A)). On the other hand, when conductor (59A) for an alignment mark is larger than the bottom surface of opening (71F) of solder-resist layer (70F) and the entire bottom surface of the opening becomes alignment mark 59, alignment mark 59 is formed directly on via conductor (60F) to be connected with via conductor (60F) (see FIG. 12(B)).

In an embodiment of the present invention, it is an option for alignment marks 59 and connection wiring to be connected to other conductive layers such as a wiring-pattern layer, through-hole conductor, via conductor and pad layer, and to be used as a power-source or ground line. Alternatively, it is not necessary for alignment marks 59 and connection wiring to be connected to other conductive layers such as a wiring-pattern layer, through-hole conductor, via conductor and pad layer. As long as individual alignment marks 59 are connected, desired effects are obtained. It is not necessary for all alignment marks 59 to be connected; it is sufficient if at least two or more alignment marks are connected.

Alignment mark 59 is exposed at the bottom of opening (71Ff) of solder-resist layer (70F). When alignment mark 59 and outermost interlayer resin insulation layer (50F) are on the bottom of opening (71Ff), exposed conductor (59A) for an alignment mark becomes alignment mark 59 regardless of the shape of opening (71Ff) (see FIGS. 6(B) and 10(B)). The shape of alignment mark 59 is any one of a cross, a ring, a rectangle and a circle, or any combination thereof (FIGS. 6(A), 8(A) and (B)). On the other hand, if the area of conductor (59A) for an alignment mark is larger than an opening bottom of the solder-resist layer and the entire opening bottom is made from the conductor, the entire bottom surface of opening (71Ff) of solder-resist layer (70F) becomes alignment mark 59 (FIGS. 9(A) and (B), 11(A) and (B), 7(A) and (B)). The shape of alignment mark 59 corresponds to the shape of opening (71Ff) of solder-resist layer (70F). The shape of alignment mark 59 is any one of a cross, a ring, a rectangle and a circle, or any combination thereof. Conductor (59A) for an alignment mark is preferred to have a larger area than the opening bottom of the solder-resist layer and to be in the shape of a circle or a rectangle (FIGS. 9(A) and (B), 11(A) and (B), 7(A)).

Alignment mark 59 is preferred to be in the shape of a cross or a ring, because such a shape is easier to recognize when a mounting apparatus tries to recognize alignment marks. Also, since it is easier to form chemical plated film on an alignment mark with a larger surface area, the entire opening bottom is preferred to become an alignment mark when an opening is formed in a solder-resist layer. The portion exposed from opening (71F) of solder-resist layer (70F) on the first-surface side buildup layer makes C4 pad (58FP). C4 solder bump (76F) for mounting an IC chip is formed on C4 pad (58FP).

The portion exposed from opening (71S) of solder-resist layer (70S) on the second-surface side buildup layer makes BGA pad (58SP). BGA solder bump (76S) for connection with a motherboard is formed on BGA pad (58SP).

Figure 5:
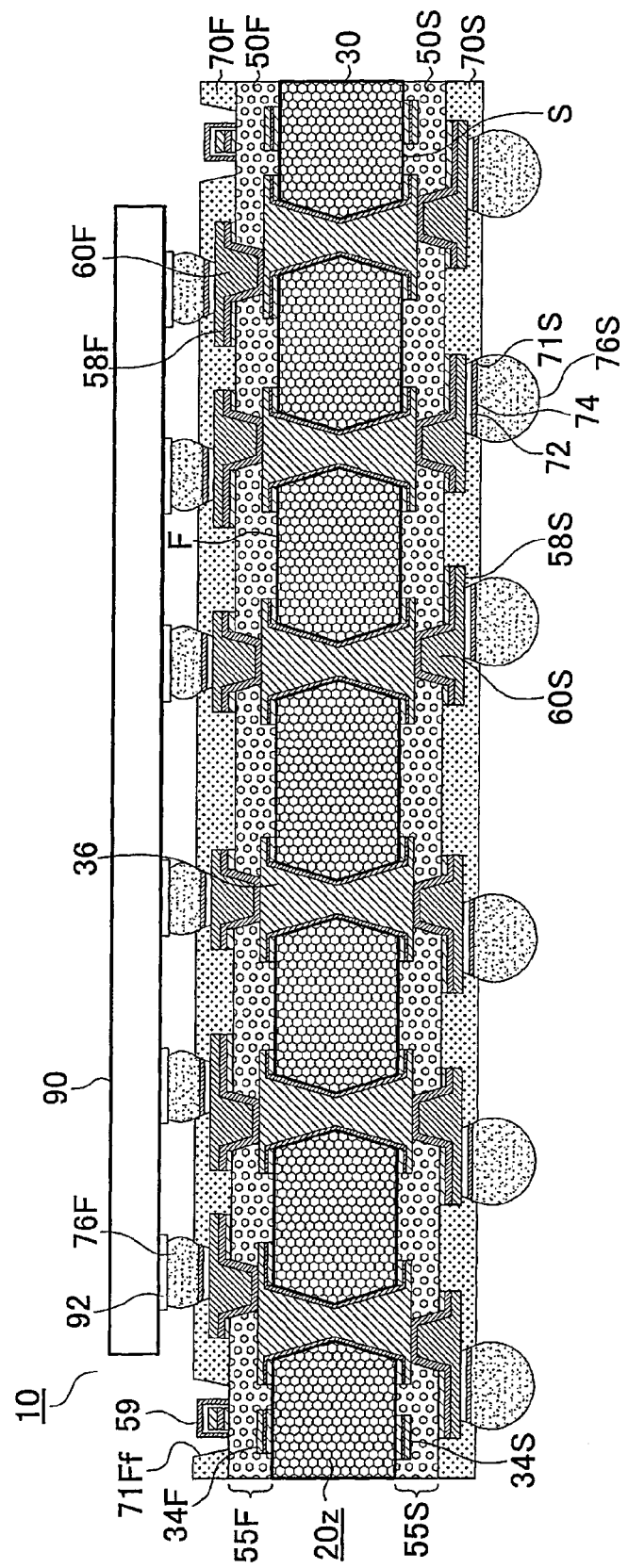
FIG. 5 is a cross-sectional view of a printed wiring board of the first embodiment with a mounted IC chip.

FIG. 5 shows a printed wiring board according to the first embodiment where an IC chip is mounted. Pad 92 of IC chip 90 is connected to C4 solder bump (76F) of the printed wiring board, and the IC chip is mounted thereon.

Figure 13:
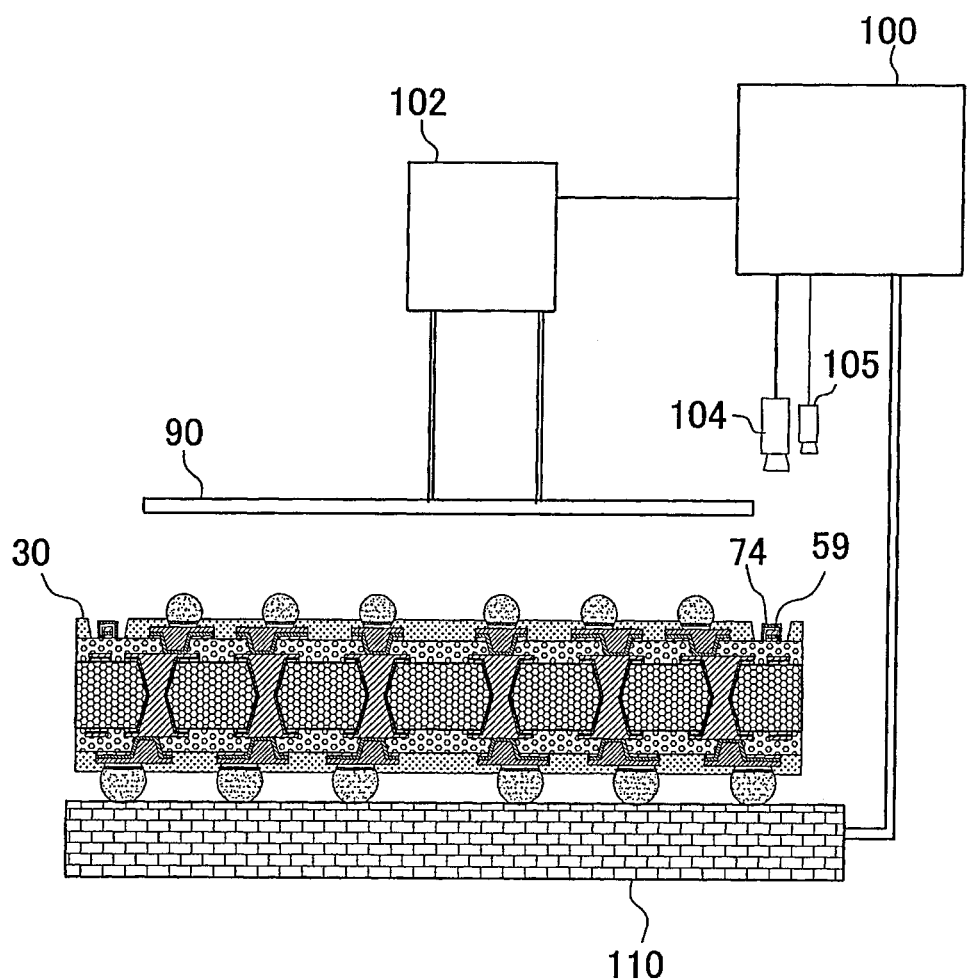
FIG. 13 is a view illustrating alignment using an optical apparatus.

FIG. 13 illustrates how alignment is conducted using an optical apparatus. Light is irradiated at alignment mark 59 of printed wiring board 10 from illuminator 105 of IC chip mounting apparatus 100. Then, the image of reflected light from the high-reflectance metal (gold-plated film 74) on the surface of alignment mark 59 is taken by camera 104. Based on the image, positioning of IC chip 90 is adjusted by adjustment apparatus 102. As described later, since gold-plated film 74 on the surface of alignment mark 59 is detected properly, alignment mark 59 is accurately recognized by an optical apparatus. Accordingly, positioning (alignment) accuracy is improved.

Method for Manufacturing a Printed Wiring Board of the First Embodiment

Figure 2:
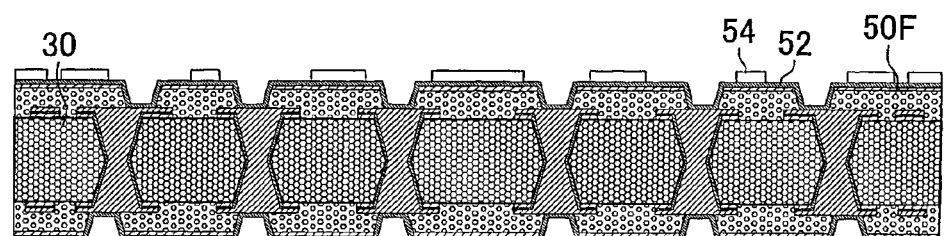
FIGS. 2(A)-2(D) are views of steps showing the method for manufacturing a printed wiring board according to the first embodiment.
Figure 2:
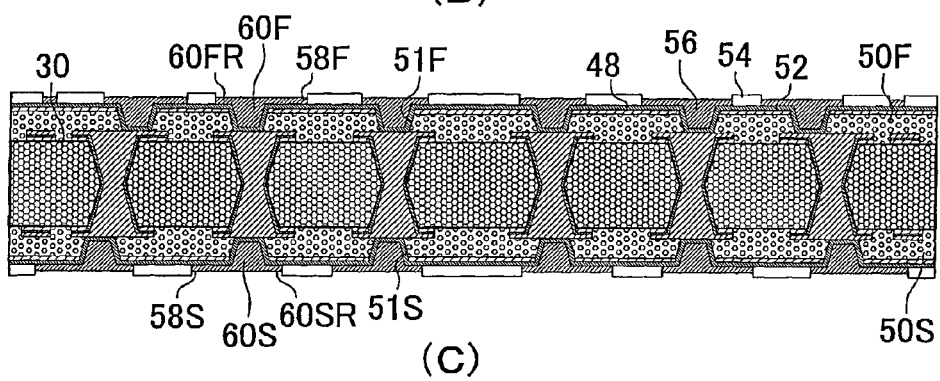
Figure 2:
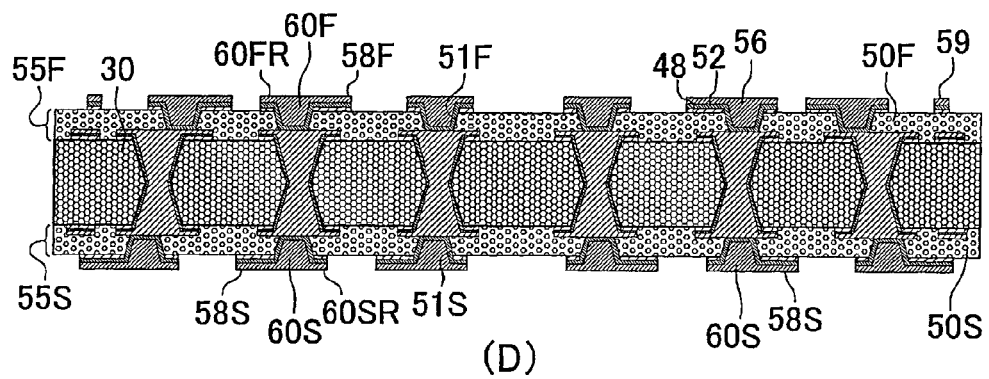
Figure 2:
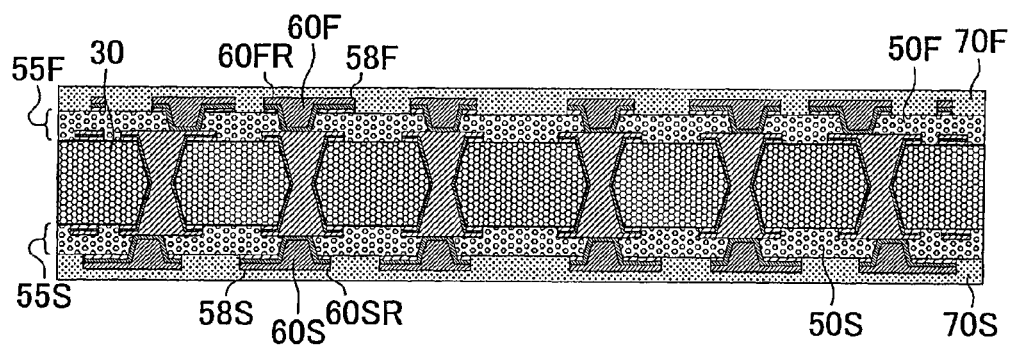
Figure 3:
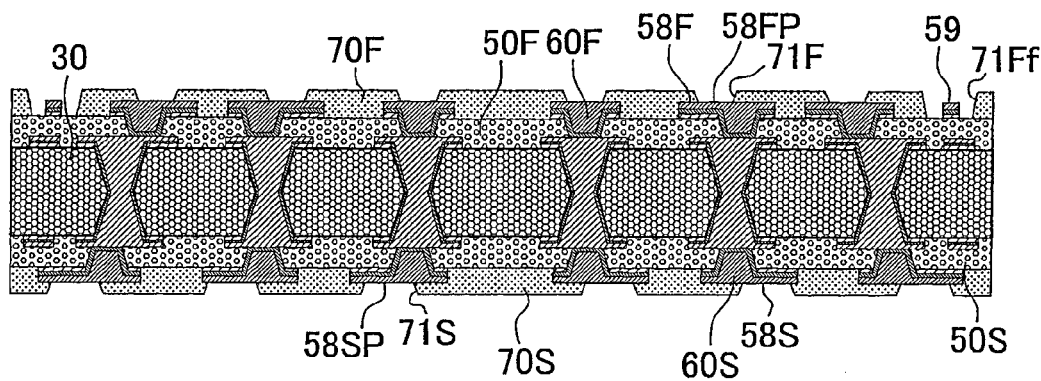
FIGS. 3(A)-3(C) are views of steps showing the method for manufacturing a printed wiring board according to the first embodiment.
Figure 3:
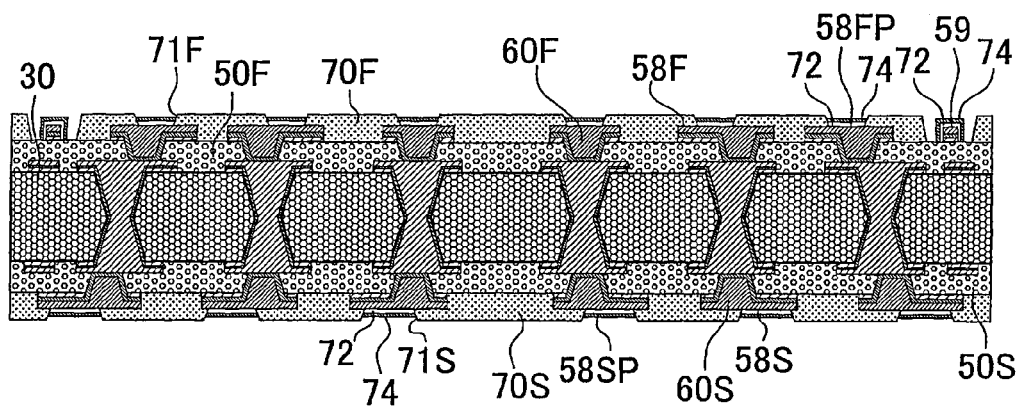
Figure 3:
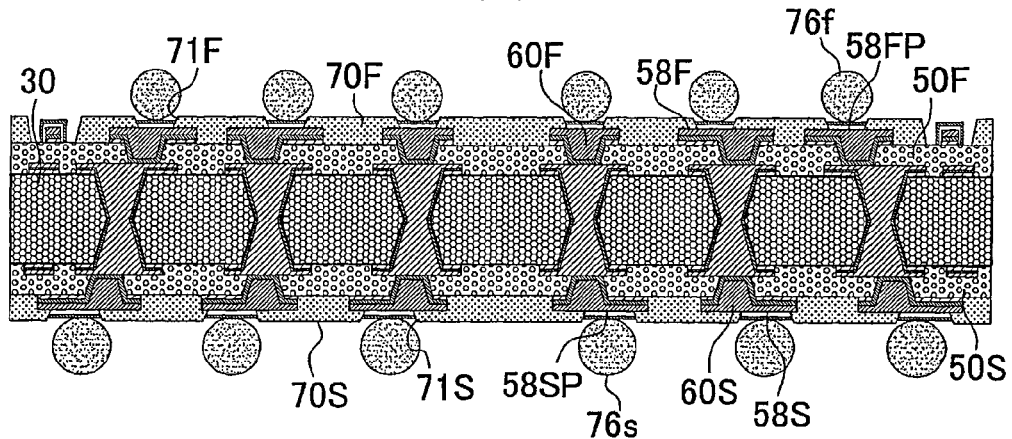

FIGS. 1~3 show a method for manufacturing printed wiring board 10 of the first embodiment.

(1) Double-sided copper-clad laminate 20 is prepared, using insulative substrate (20z) having first surface (F) and second surface (S) opposite the first surface, and metal foils (22, 22) laminated on both of its surfaces (FIG. 1(A)). ELC4785TH-G made by Sumitomo Bakelite Co., Ltd. may be used for a double-sided copper-clad laminate. Copper foils (22, 22) are respectively laminated on first surface (F) and second surface (S) of the insulative substrate.

(2) The double-sided copper-clad laminate is processed, and core substrate 30 with through-hole conductor 36, first conductive layer (34F) and second conductive layer (34S) is complete (FIG. 1(B)). The first surface of the core substrate corresponds to the first surface of the insulative substrate, and the second surface of the core substrate corresponds to the second surface of the insulative substrate. Core substrate 30 is manufactured by the method disclosed in U.S. Pat. No. 7,786, 390.

(3) Prepreg, which contains inorganic fiber, inorganic particles such as silica and thermosetting resin such as epoxy, and copper foil 48 are laminated in that order on first surface (F) and second surface (S) of core substrate 30. Then, thermal pressing is conducted so that interlayer resin insulation layer (50F) and interlayer resin insulation layer (50S) are formed from the prepreg, and copper foils 48 are adhered to the interlayer resin insulation layers (FIG. 1(C)). Here, interlayer resin insulation layers containing inorganic fiber are laminated; however, it is also an option to use interlayer resin insulation layers that do not contain core material.

(4) Next, using a CO2 gas laser, via-conductor openings (51F, 51S) are formed in interlayer resin insulation layers (50F, 50S) respectively (FIG. 1(D)).

(5) Electroless plated films (52, 52) are formed on copper foils 48 and on the inner walls of openings (51F, 51S) (FIG. 1(E)).

(6) Plating resist 54 is formed on electroless plated film 52 (FIG. 2(A)).

(7) Electrolytic plated film 56 is formed on electroless plated film 52 exposed from plating resist 54 (FIG. 2(B)). It is an option to fill openings (51F, 51S) with plating as shown in FIG. 2(B).

(8) Plating resist 54 is removed. Electroless plated film and copper foil between portions of electrolytic plated film are etched away so that conductive layers (58F, 58S), via conductors (60F, 60S), via lands (60FR, 60SR), alignment marks 59 and connection wiring (58FC) (see FIG. 6(A)) are formed (FIG. 2(C)). FIG. 6(A) corresponds to a plan view of FIG. 2(C)). Upper and lower buildup layers (55F, 55S) are formed.

(9) First-surface side solder-resist layer (70F) is formed on first-surface side buildup layer (55F), and second-surface side solder-resist layer (70S) is formed on second-surface side buildup layer (55S) (FIG. 2(D)).

(10) Through exposure and development treatments, opening (71F) to expose C4 pad (58FP) and opening (71Ff) to expose alignment mark 59 are formed in first-surface side solder-resist layer (70F), and opening (71S) to exposed BGA pad (58SP) is formed in the second-surface side solder-resist layer (FIG. 3(A)). FIG. 6(B) corresponds to a plan view of FIG. 3(A).

(11) Electroless nickel-plated film 72 is formed on C4 pad (58FP), alignment mark 59 and BGA pad (58SP), and electroless gold-plated film 74 is further formed on electroless nickel-plated film 72 (FIG. 3(B)). Nickel-palladium-gold films may be formed instead of nickel-gold films. Since C4 pad (58FP) and BGA pad (58SP) are connected through inner wiring, the electric potential on surfaces of alignment marks stabilizes, resulting in appropriate formation of electroless nickel-plated film 72 and electroless gold-plated film 74. In the first embodiment, alignment marks 59 in four corners are connected by connection wiring (58FC). When electroless plated film is formed on a surface of alignment mark 59, the area of reaction with an electroless plating solution increases in proportion to the area of the exposed surface of the alignment mark, thus increasing the number of electrons received from the electroless plating solution. Accordingly, it is thought that the electric potential on the surface of alignment mark 59 stabilizes, and electroless plated film is securely formed. The size of alignment mark 59 formed on the outermost layer is limited from a design perspective. Therefore, multiple alignment marks 59 are connected by connection wiring for short circuiting, instead of being formed independently on outermost interlayer resin insulation layer (50F). At that time, even if the number of electrons received from an electroless plating solution to surfaces of alignment marks 59 differs among alignment marks 59, it is thought that the electrons move from a portion with high electric potential to a portion with low electric potential, giving all alignment marks 59 the same electric potential. Accordingly, electroless plated film is thought to be formed with a uniform thickness on all alignment marks 59.

(12) Using a mask for loading solder balls (not shown in the drawings), solder ball (76f) is loaded on C4 pad (58FP), and solder ball (76s) is loaded on BGA pad (58SP) (FIG. 3(C)).

(13) By conducting a reflow process, C4 solder bump (76F) is formed on C4 pad (58FP), and BGA bump (76S) is formed on BGA pad (58SP). Accordingly, printed wiring board 10 is completed (FIG. 4).

(14) As described above by referring to FIG. 13, alignment is adjusted between the printed wiring board and an IC chip by optically recognizing alignment marks 59 so that a C4 bump of the printed wiring board is aligned with pad 92 of the IC chip, and IC chip 90 is mounted on printed wiring board 10 through a reflow process (FIG. 5).

(15) After the above, the printed wiring board is mounted on a motherboard through BGA bump (76S) (not shown in the drawings).

First Modified Example of the First Embodiment

Figure 8:
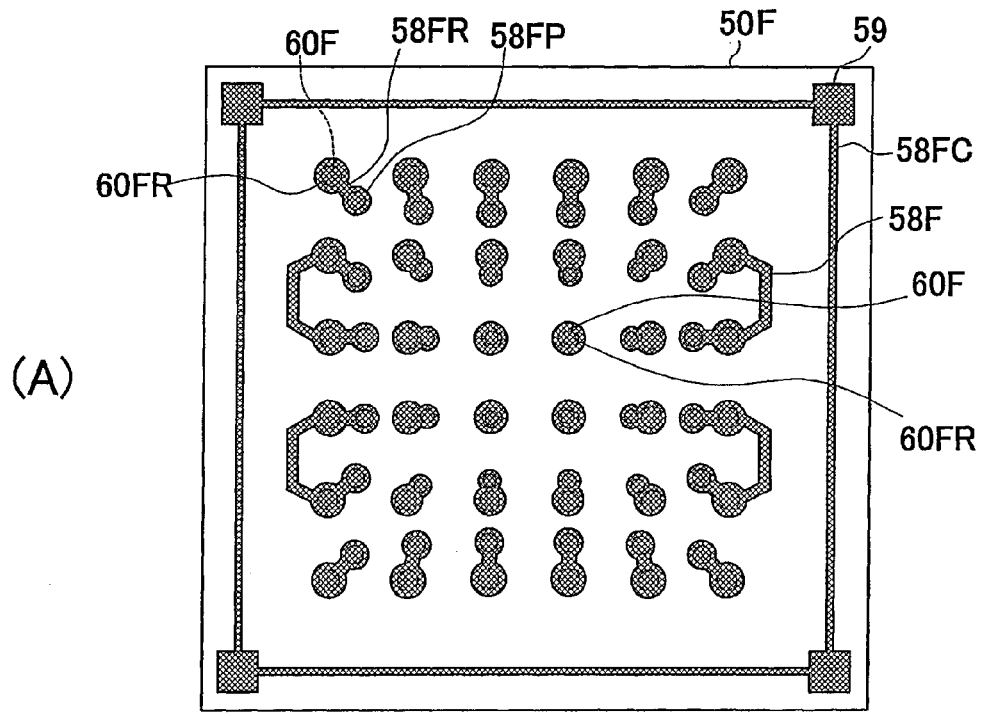
FIG. 8(A) is a plan view of an outermost interlayer resin insulation layer of a printed wiring board according to a first modified example of the first embodiment.
FIG. 8(B) is a plan view of an outermost interlayer resin insulation layer of a printed wiring board according to a second modified example of the first embodiment.
Figure 8:
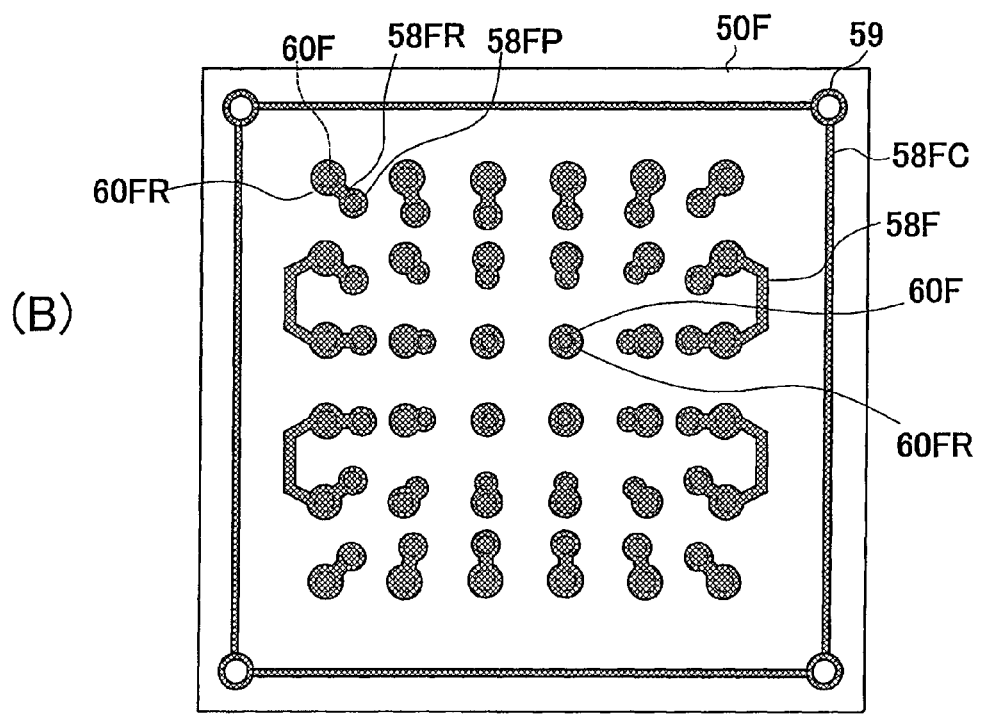

FIG. 8(A) is a plan view of outermost interlayer resin insulation layer (50F) of a printed wiring board according to a first modified example of the first embodiment. In the first modified example of the first embodiment, alignment marks 59 are formed in the shape of a rectangle. Alignment marks may also be formed in the shape of a polygon with three or more corners.

Second Modified Example of the First Embodiment

FIG. 8(B) is a plan view of outermost interlayer resin insulation layer (50F) of a printed wiring board according to a second modified example of the first embodiment. In the second modified example of the first embodiment, alignment marks 59 are formed in the shape of a ring.

Third Modified Example of the First Embodiment

Figure 9:
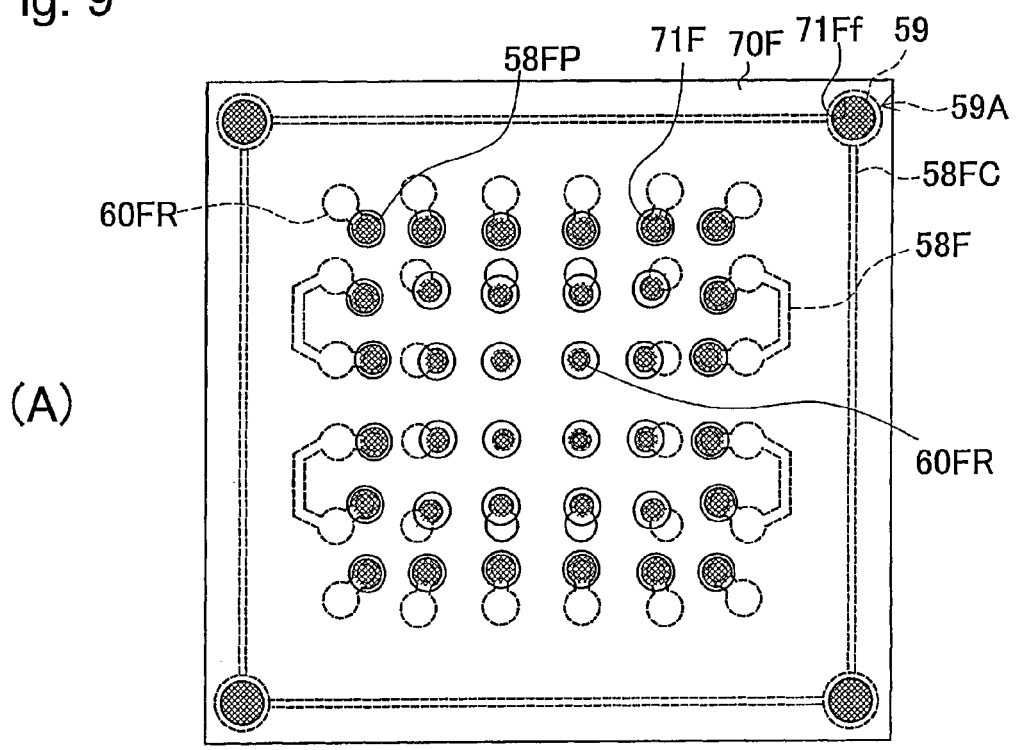
FIGS. 9(A)-9(B) are plan views of a solder-resist layer of a printed wiring board according to a third modified example of the first embodiment.
Figure 9:
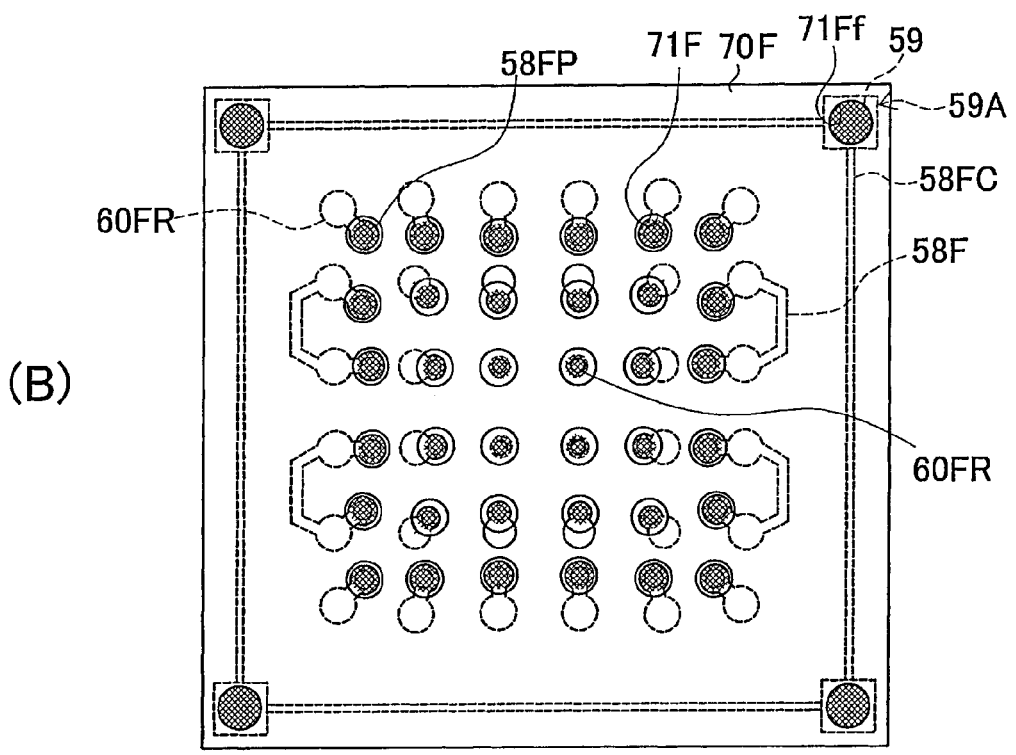

FIGS. 9(A) and 9(B) are plan views of solder-resist layer (70F) of a printed wiring board according to a third modified example of the first embodiment. In the third modified example of the first embodiment, conductor (59A) for an alignment mark is designed to be larger than opening (71Ff) of the solder-resist layer, and the shape of opening (71F0 of solder-resist layer (70F) sets the shape of alignment mark 59 accordingly. To increase the surface area of alignment mark 59, a circular or rectangular shape is preferred. In the third modified example, circular and rectangular shapes are employed.

Fourth Modified Example of the First Embodiment

Figure 7:
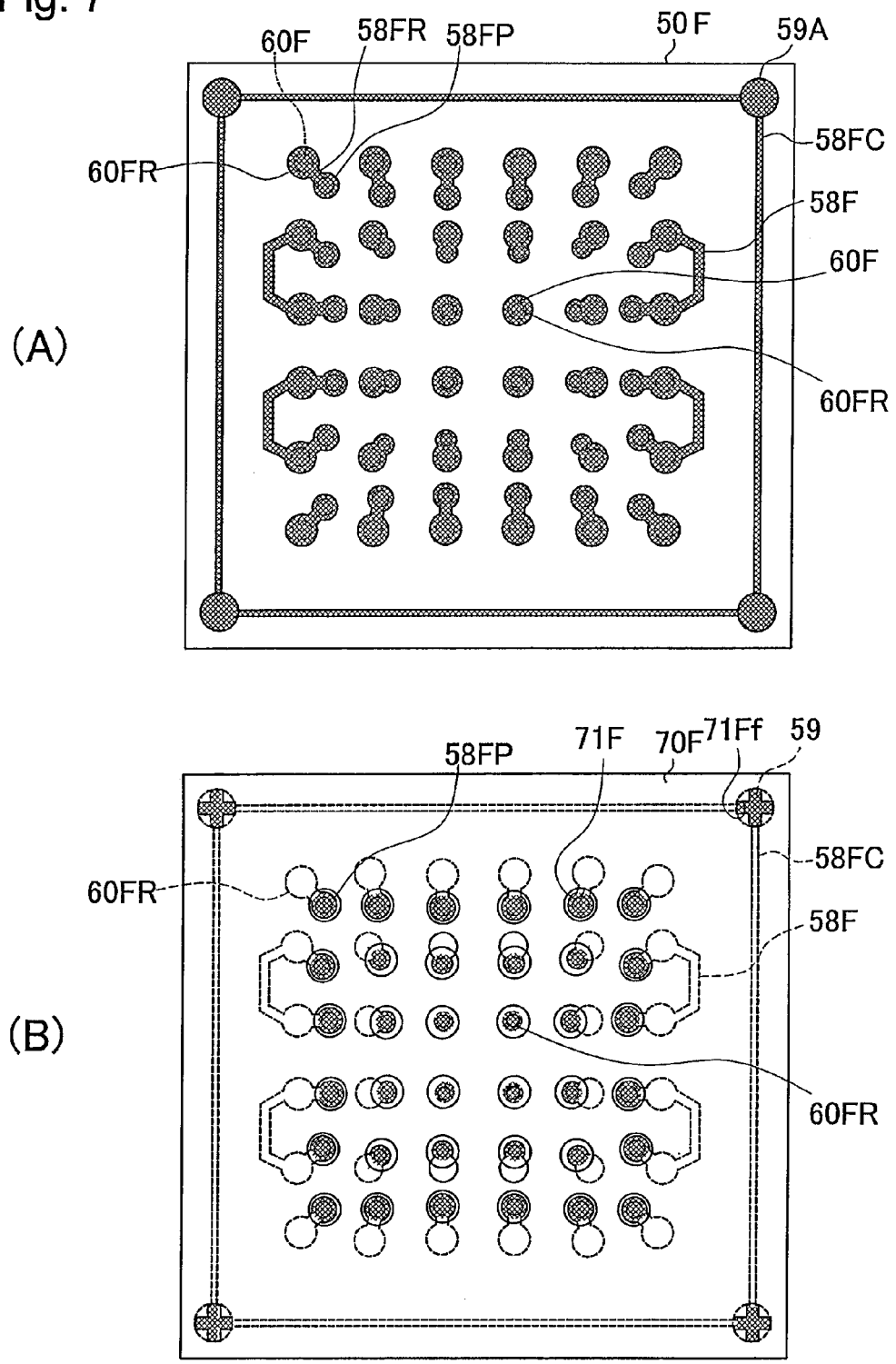
FIG. 7(A) is a plan view of an outermost interlayer resin insulation layer of a printed wiring board according to a fourth modified example of the first embodiment.
FIG. 7(B) is a plan view of an upper solder-resist layer.

FIG. 7(A) is a plan view of outermost interlayer resin insulation layer (50F) of a printed wiring board according to a fourth modified example of the first embodiment, and FIG. 7(B) is a plan view of upper solder-resist layer (70F). In the fourth modified example of the first embodiment, conductor (59A) for an alignment mark is formed in the shape of a circle. Opening (71Ff) of solder-resist layer (70F) formed on conductor (59A) for an alignment mark is formed in the shape of a cross, and alignment mark 59 is optically recognized as a cross.

Second Embodiment

Figure 10:
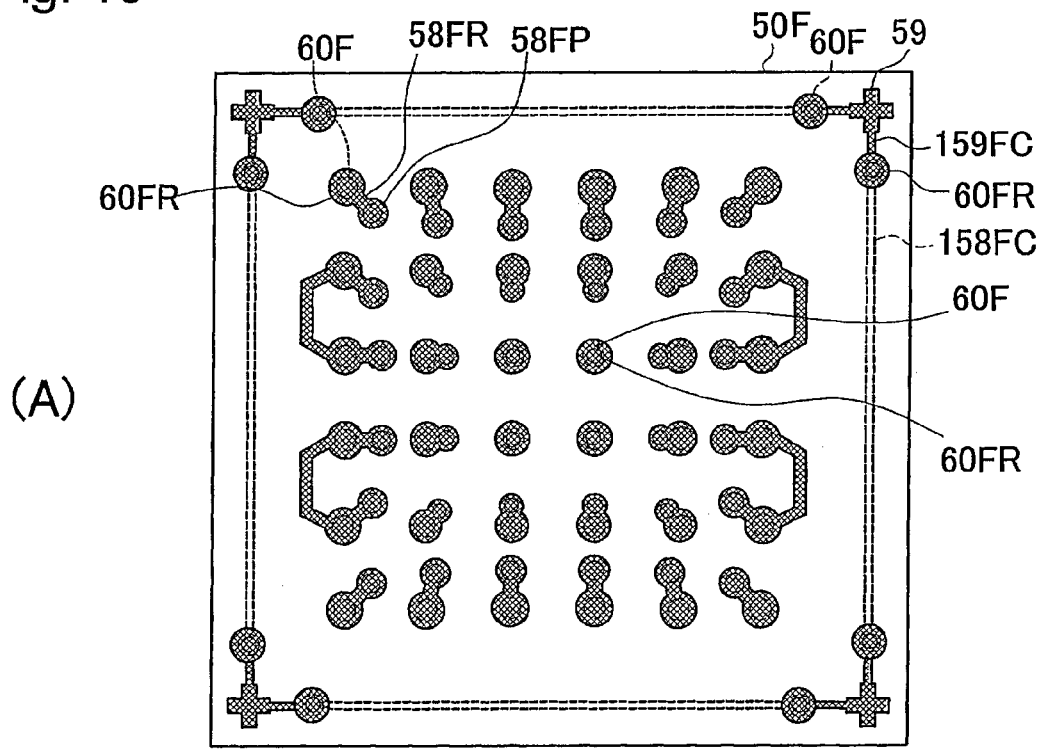
FIG. 10(A) is a plan view of an outermost interlayer resin insulation layer of a printed wiring board according to a second embodiment.
FIG. 10(B) is a plan view of an upper solder-resist layer.
Figure 10:
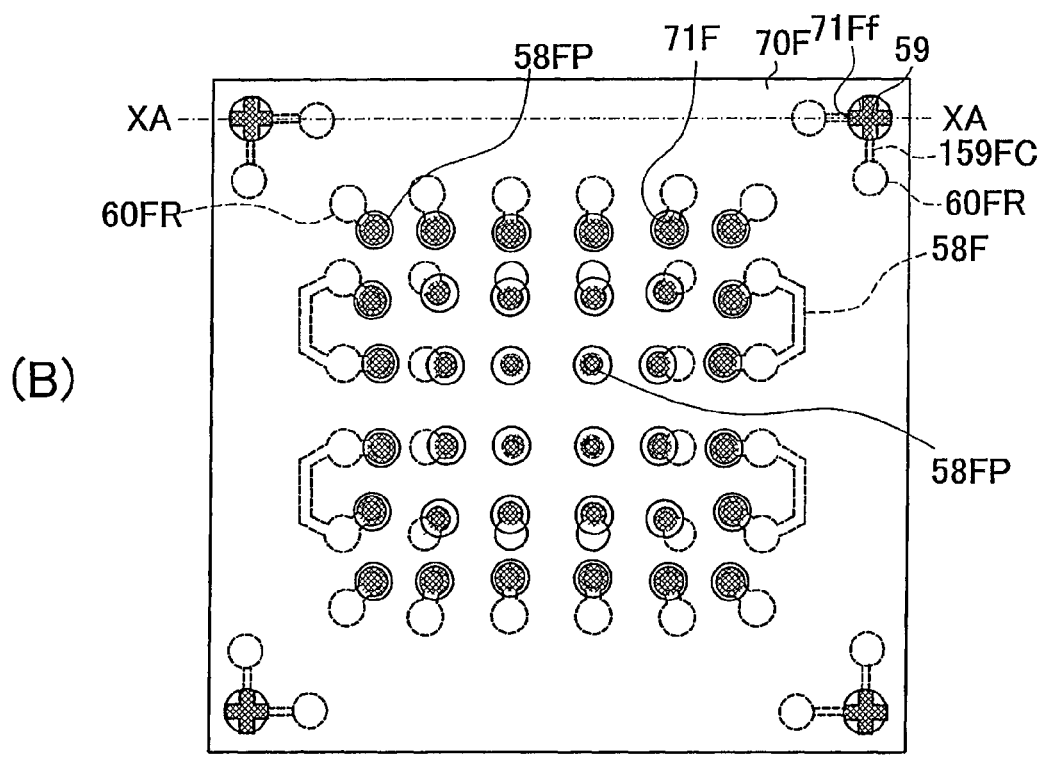

FIG. 10(A) is a plan view of outermost interlayer resin insulation layer (50F) of a printed wiring board according to a second embodiment, and FIG. 10(B) is a plan view of upper solder-resist layer (70F). FIG. 12(A) is a cross-sectional view of the printed wiring board at (XA-XA) in FIG. 10(B). In the second embodiment, alignment mark 59 at each of four corners is connected to the lower side of outermost interlayer resin insulation layer (50F), namely, to connection wiring (158FC) formed on lower interlayer resin insulation layer (150F), through second connection wiring (159FC) and via conductor (60F). In the second embodiment, connection wiring (158FC) is formed while avoiding outermost interlayer resin insulation layer (50F), which is electrically close to an IC chip. Thus, electroless nickel-plated film 72 and electroless gold-plated film 74 are securely formed on alignment marks 59 while lowering the impact on electrical characteristics from connection wiring (158FC).

First Modified Example of the Second Embodiment

Figure 11:
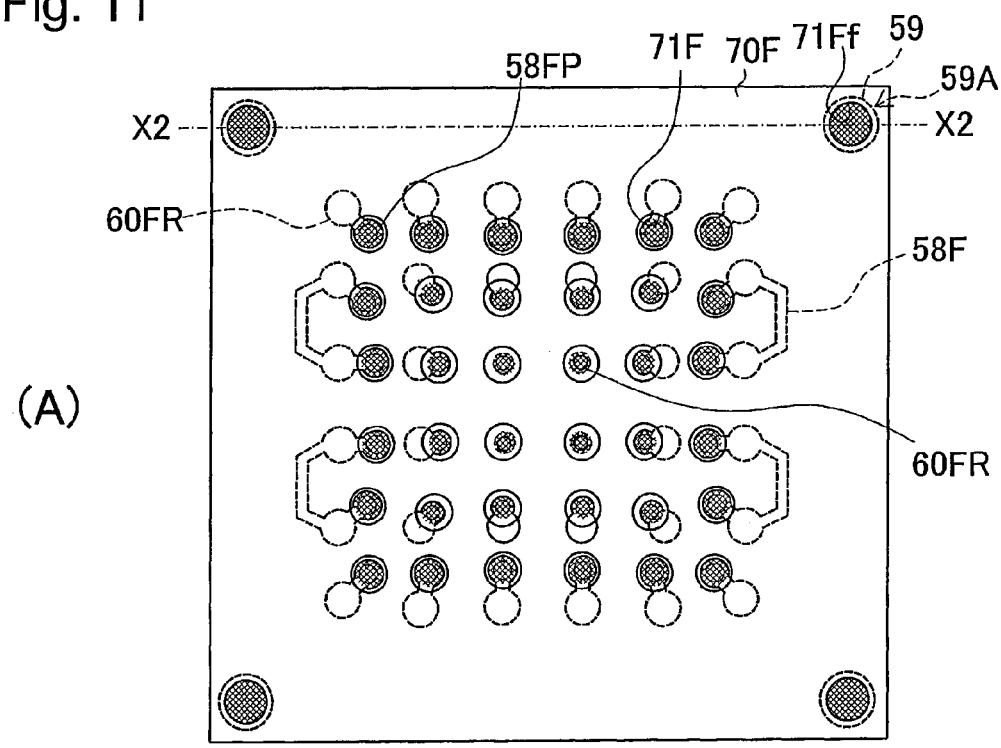
FIG. 11(A) is a plan view of an upper solder-resist layer of a printed wiring board according to a first modified example of the second embodiment.
FIG. 11(B) is a plan view of an upper solder-resist layer of a printed wiring board according to a second modified example of the second embodiment.
Figure 11:
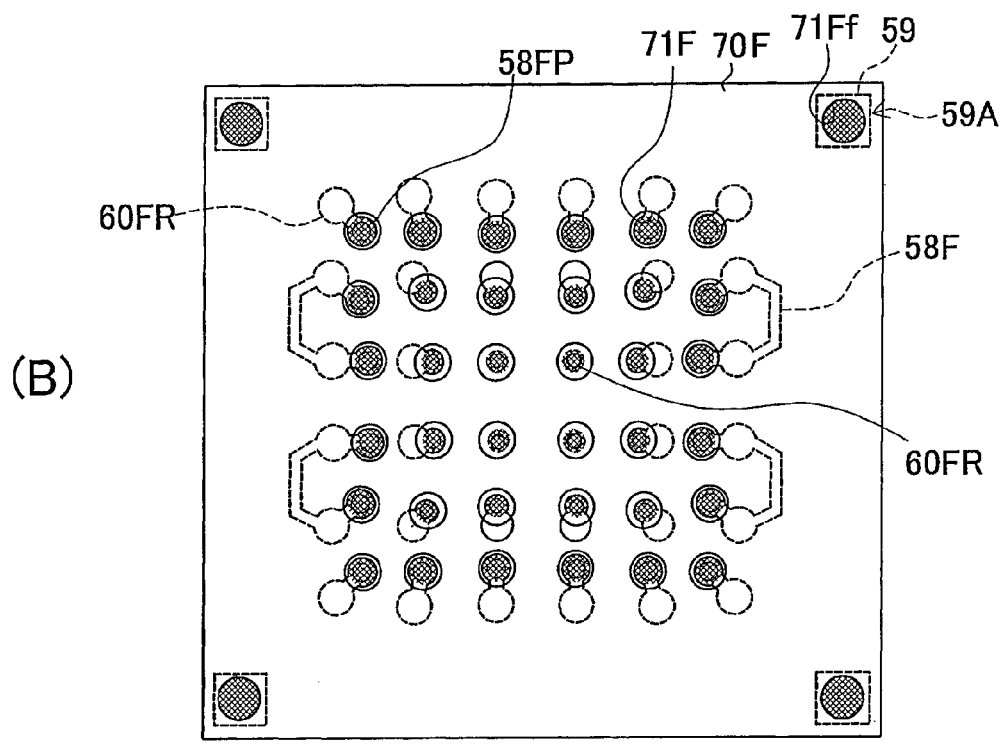

FIG. 11(A) is a plan view of a printed wiring board according to a first modified example of the second embodiment, and FIG. 12(B) is a cross-sectional view of the printed wiring board at (X2-X2) in FIG. 11(A). Conductor (59A) for an alignment mark is set larger than opening (71Ff) of solder-resist layer (70F), thus the opening shape of solder-resist layer (70F) sets the shape of alignment mark 59 accordingly. To increase the surface area of alignment mark 59, a circular shape is employed in the first modified example of the second embodiment.

Second Modified Example of the Second Embodiment

FIG. 11(B) is a plan view of a printed wiring board according to a second modified example of the second embodiment. Conductor (59A) for an alignment mark is set larger than opening (71Ff) of the solder-resist layer, thus the opening shape of the solder-resist layer sets the shape of alignment mark 59 accordingly. To increase the surface area of alignment mark 59, a rectangular shape is employed in the second modified example of the second embodiment.

A printed wiring board according to an embodiment of the present invention has alignment marks which can be easily recognized by an optical apparatus, and another embodiment of the present invention is a method for manufacturing such a printed wiring board.

A printed wiring board according to an embodiment of the present invention has the following technological features: an outermost interlayer resin insulation layer; an outermost conductive layer including multiple alignment marks formed on the outermost interlayer resin insulation layer; connection wiring connecting the alignment marks; a solder-resist layer formed on the outermost interlayer resin insulation layer and on the outermost conductive layer and having openings to respectively expose the alignment marks; and an electroless plated film formed on the alignment marks exposed in the openings of the solder-resist layer.

A method for manufacturing a printed wiring board according to an embodiment of the present invention include the following: on an outermost interlayer resin insulation layer, forming an outermost conductive layer including multiple alignment marks; forming connection wiring to connect the alignment marks; on the outermost interlayer resin insulation layer and on the outermost conductive layer, forming a solder-resist layer having an opening to expose an individual alignment mark; and forming electroless plated film exposed in an opening of the solder-resist layer.

In a printed wiring board according to an embodiment of the present invention, alignment marks formed respectively near four corners of a printed wiring board are connected by connection wiring. Thus, surfaces of the alignment marks are securely covered with electroless plated film. Accordingly, recognizing the alignment marks is easy.

In a method for manufacturing a printed wiring board according to an embodiment of the present invention, since alignment marks are connected by connection wiring, surfaces of the alignment marks are securely covered with electroless plated film. Thus, recognizing such alignment marks is easy.

In a printed wiring board according to an embodiment of the present invention, and in a method for manufacturing a printed wiring board according to an embodiment of the present invention, connection wiring is formed under an outermost interlayer resin insulation layer, and alignment marks are connected to the connection wiring formed under the outermost interlayer resin insulation layer through via conductors. Thus, surfaces of the alignment marks are securely covered with electroless plated film. Moreover, since the connection wiring is formed on a lower interlayer resin insulation layer under the outermost interlayer resin insulation layer, the electrical characteristics are suppressed from lowering, making the alignment marks easy to recognize.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an outermost interlayer resin insulation layer;
an outermost conductive layer formed on the outermost interlayer resin insulation layer and including a plurality of alignment marks;
a connection wiring structure connecting the alignment marks;
a solder-resist layer formed on the outermost interlayer resin insulation layer and the outermost conductive layer; and
a lower interlayer resin insulation layer formed underneath the outermost interlayer resin insulation layer,
wherein the solder-resist layer has a plurality of openings exposing the alignment marks, respectively, and each of the alignment marks has an electroless plated film formed on each of the alignment marks, the connection wiring structure is positioned between the outermost interlayer resin insulation layer and the lower interlayer resin insulation layer, and the connection wiring structure is connected to the alignment marks through a plurality of via conductors formed in the outermost interlayer resin insulation layer.

2. The printed wiring board according to claim 1, wherein the alignment marks are positioned in four corners of the outermost interlayer resin insulation layer.

3. The printed wiring board according to claim 1, wherein the alignment marks are formed directly on the via conductors, respectively.

4. The printed wiring board according to claim 1, further comprising a second connection wiring structure connecting the via conductors and the alignment marks on the outermost interlayer resin insulation layer.

5. The printed wiring board according to claim 1, wherein the electroless plated film comprises a nickel layer and a gold layer.

6. The printed wiring board according to claim 1, wherein the electroless plated film is formed of a nickel layer and a gold layer.

7. The printed wiring board according to claim 1, wherein the connection wiring structure forms one of a power source conductor and a ground conductor.

8. The printed wiring board according to claim 1, wherein the plurality of alignment marks has at least one of a cross shape, a ring shape, a rectangle shape and a circle shape.

9. The printed wiring board according to claim 1, wherein the electroless plated film comprises a nickel layer and a gold layer, and the connection wiring structure forms one of a power source conductor and a ground conductor.

10. The printed wiring board according to claim 3, wherein the alignment marks are positioned in four corners of the outermost interlayer resin insulation layer.

11. The printed wiring board according to claim 3, wherein the connection wiring structure forms one of a power source conductor and a ground conductor.

12. The printed wiring board according to claim 3, wherein the electroless plated film comprises a nickel layer and a gold layer.

13. A method for manufacturing a printed wiring board, comprising:
forming a connection wiring structure on a lower interlayer resin insulation layer;
forming an outermost interlayer resin insulation layer on the lower interlayer resin insulation layer and the connection wiring structure;
forming a plurality of via conductors in the outermost interlayer resin insulation layer such that the plurality of via conductors is connected to the connection wiring structure;
forming on the outermost interlayer resin insulation layer an outermost conductive layer including a plurality of alignment marks such that the plurality of alignment marks is connected to the connection wiring structure through the plurality of via conductors, respectively; forming a solder-resist layer on the outermost interlayer resin insulation layer and the outermost conductive layer; forming a plurality of openings in the solder-resist layer such that the openings expose the alignment marks, respectively; and forming an electroless plated film in the opening of the solder-resist layer such that each of the alignment marks has the electroless plated film formed on each of the alignment marks.

14. The method for manufacturing a printed wiring board according to claim 13, wherein the forming of the outermost conductive layer includes forming the alignment marks in four corners of the outermost interlayer resin insulation layer.

15. The method for manufacturing a printed wiring board according to claim 13, wherein the forming of the alignment marks comprises forming the alignment marks directly on the via conductors, respectively.

16. The method for manufacturing a printed wiring board according to claim 13, wherein the electroless plated film comprises a nickel layer and a gold layer.

17. The method for manufacturing a printed wiring board according to claim 13, wherein the forming of the connection wiring structure comprises forming one of a power source conductor comprising the connection wiring structure and a ground conductor comprising the connection wiring structure.

18. The method for manufacturing a printed wiring board according to claim 13, wherein the plurality of alignment marks has at least one of a cross shape, a ring shape, a rectangle shape and a circle shape.

19. The method for manufacturing a printed wiring board according to claim 13, wherein the forming of the outermost conductive layer includes forming a second connection wiring structure connecting the via conductors and the alignment marks on the outermost interlayer resin insulation layer.

20. The method for manufacturing a printed wiring board according to claim 16, wherein the forming of the connection wiring structure comprises forming one of a power source conductor comprising the connection wiring structure and a ground conductor comprising the connection wiring structure.

* * * * *